(12) United States Patent
Bresser et al.

(10) Patent No.: US 11,047,881 B2
(45) Date of Patent: *Jun. 29, 2021

(54) MEASURING SYSTEM AND METHOD (71) Applicant: Rohde & Schwarz GmbH & Co. KG, Munich (DE)

(72) Inventors: Gerd Bresser, Munich (DE); Friedrich Reich, Stadtbergen (DE)

(*) Notice: Subject to any disclaimer, the term of this patent is extended or adjusted under 35 U.S.C. 154(b) by 237 days.

This patent is subject to a terminal disclaimer.

(21) Appl. No.: 15/871,814

(22) Filed: Jan. 15, 2018

(65) Prior Publication Data

US 2019/0113541 A1 Apr. 18, 2019

(30) Foreign Application Priority Data

Oct. 12, 2017 (EP) .................................. 17196106

(51) Int. Cl.
| | |
|---|---|
| *G01R 13/02* | (2006.01) |
| *G01R 19/25* | (2006.01) |
| *G01R 1/067* | (2006.01) |
| *G01R 1/073* | (2006.01) |

(Continued)

(52) U.S. Cl.
CPC ......... *G01R 13/02* (2013.01); *G01R 1/06788* (2013.01); *G01R 1/073* (2013.01); *G01R 1/07307* (2013.01); *G01R 13/28* (2013.01); *G01R 19/25* (2013.01); *G06F 13/4282* (2013.01); *G06F 2213/0012* (2013.01)

(58) Field of Classification Search
CPC combination set(s) only.
See application file for complete search history.

(56) References Cited

U.S. PATENT DOCUMENTS

| | | | |
|---|---|---|---|
| 5,959,607 | A | 9/1999 | Montijo |
| 7,191,079 | B2 | 3/2007 | Smith et al. |
| 7,463,015 | B2 | 12/2008 | Mende et al. |

(Continued)

FOREIGN PATENT DOCUMENTS

| | | |
|---|---|---|
| CN | 106646149 A | 5/2017 |
| EP | 1890166 A1 | 2/2008 |

(Continued)

OTHER PUBLICATIONS

U.S. Appl. No. 15/871,801, filed by Gerd Bresser et al., filed Jan. 15, 2018.

(Continued)

*Primary Examiner* — Matthew G Marini (57) ABSTRACT

A measuring system for measuring signals with multiple measurement probes comprises a multi probe measurement device comprising at least two probe interfaces that each couple the multi probe measurement device with at least one of the measurement probes, a data interface that couples the multi probe measurement device to a measurement data receiver, and a processing unit coupled to the at least two probe interfaces that records measurement values via the at least two probe interfaces from the measurement probes, wherein the processing unit is further coupled to the data interface and provides the recorded measurement values to the measurement data receiver, and a measurement data receiver comprising a data interface, wherein the data interface of the measurement data receiver is coupled to the data interface of the multi probe measurement device.

19 Claims, 4 Drawing Sheets

(51) Int. Cl.
*G01R 13/28* (2006.01)
*G06F 13/42* (2006.01)

(56) References Cited

U.S. PATENT DOCUMENTS

| | | | |
|---|---|---|---|
| 8,324,885 B2 | 12/2012 | Dobyns | |
| 8,487,608 B2 | 7/2013 | Peschke et al. | |
| 8,818,744 B2 | 8/2014 | Martin et al. | |
| 8,952,681 B2 | 2/2015 | Kuhwald et al. | |
| 2005/0210340 A1 | 9/2005 | Townsend et al. | |
| 2008/0159368 A1 | 7/2008 | Mende et al. | |
| 2009/0204403 A1* | 8/2009 | Hollander | G01D 7/12 704/260 |
| 2011/0163735 A1 | 7/2011 | Peschke et al. | |
| 2012/0119726 A1 | 5/2012 | Kuhwald et al. | |
| 2014/0320145 A1 | 10/2014 | Johnson et al. | |
| 2016/0139178 A1* | 5/2016 | Johnson | G01R 1/30 324/754.03 |
| 2017/0124736 A1 | 5/2017 | Bresser | |

FOREIGN PATENT DOCUMENTS

| | | |
|---|---|---|
| GB | 2039198 A | 12/1978 |
| WO | 2011103550 A1 | 8/2011 |

OTHER PUBLICATIONS

U.S. Appl. No. 15/871,831, filed by by Gerd Bresser et al., filed Jan. 15, 2018.
Search Report from counterpart European Application No. 17196106.3, dated May 8, 2018, 13 pp.
Office Action from U.S. Appl. No. 15/871,801, dated Nov. 8, 2019, 10 pp.
Response to Office Action dated Nov. 8, 2019, from U.S. Appl. No. 15/871,801, filed Feb. 10, 2020, 9 pp.
Final Office Action from U.S. Appl. No. 15/871,801, dated Mar. 24, 2020, 11 pp.
Restriction Requirement from U.S. Appl. No. 15/871,831, dated Sep. 11, 2019, 5 pp.
Response to Restriction Requirement dated Sep. 11, 2019, from U.S. Appl. No. 15/871,831, filed Nov. 12, 2019, 3 pp.
Office Action from U.S. Appl. No. 15/871,831 dated Dec. 9, 2019, 9 pp.
Response to Office Action dated Dec. 9, 2019, from U.S. Appl. No. 15/871,831, filed Mar. 9, 2020, 15 pp.
Office Action from U.S. Appl. No. 15/871,831, dated Apr. 9, 2020, 8 pp.
Response to Office Action dated Apr. 9, 2020, from U.S. Appl. No. 15/871,831, filed Jun. 9, 2020, 10 pp.
Response to Office Action dated Mar. 24, 2020, from U.S. Appl. No. 15/871,801, filed May 26, 2020, 10 pp.
Office Action from U.S. Appl. No. 15/871,801, dated Jun. 16, 2020, 11 pp.
Office Action from U.S. Appl. No. 15/871,831, dated Aug. 11, 2020, 11 pp.
Response to Office Action dated Jun. 16, 2020, from U.S. Appl. No. 15/871,801, filed Sep. 16, 2020, 9 pp.
Response to Office Action dated Aug. 11, 2020, from U.S. Appl. No. 15/871,831, filed Nov. 11, 2020, 12 pp.
Office Action from U.S. Appl. No. 15/871,831, dated Dec. 22, 2020, 11 pp.
Final Office Action from U.S. Appl. No. 15/871,801, dated Dec. 17, 2020, 8 pp.
Response to Final Office Action dated Dec. 17, 2020, from U.S. Appl. No. 15/871,801, filed Feb. 17, 2021, 9 pp.
Notice of Allowance from U.S. Appl. No. 15/871,801, dated Mar. 1, 2021, 5 pp.

* cited by examiner

MEASURING SYSTEM AND METHOD

TECHNICAL FIELD

The present invention relates to a measuring system and a respective method.

BACKGROUND

Although applicable in principal to any measurement system, the present invention and its underlying problem will be hereinafter described in combination with oscilloscopes.

Modern oscilloscopes usually comprise a number of analog input channels that each comprise a high quality high speed analog-to-digital converter for converting analog signals into digital signals for further analysis. Such analog signals may be in the GHz range. The analog-to-digital converters are therefore optimized for high speed signal acquisition.

In modern electronics it may however not be sufficient to analyze the high frequency analog signals in a device under test. It may also be required to analyze the behavior of the digital device under test under different environmental conditions.

Such measurements are however difficult to implement with oscilloscopes and usually include performing separate measurements of the signals in the device under test and any environmental variables. The measured values may then e.g. be compared offline, e.g. on a computer.

Against this background, the problem addressed by the present invention is providing an improved measurement for devices under test under varying environmental conditions.

SUMMARY

The present invention solves this object by a measuring system with the features of claim 1, and a method with the features of claim 16.

Accordingly it is provided:

A measuring system for measuring signals with multiple measurement probes comprises a multi probe measurement device that comprising at least two probe interfaces that each couple the multi probe measurement device with at least one of the measurement probes, a data interface that couples the multi probe measurement device to a measurement data receiver, and a processing unit coupled to the at least two probe interfaces that records measurement values via the at least two probe interfaces from the measurement probes, wherein the processing unit is further coupled to the data interface and provides the recorded measurement values to the measurement data receiver, and a measurement data receiver comprising a data interface, wherein the data interface of the measurement data receiver is coupled to the data interface of the multi probe measurement device.

In addition, it is provided:

A method for measuring electrical signals, the method comprising coupling a multi probe measurement device to a measurement data receiver with analog measurement channels via a data interface, connecting at least one measurement probe to the multi probe measurement device, measuring analog signals with the measurement data receiver, recording measurement values with the multi probe measurement device, and providing the recorded measurement values from the multi probe measurement device to the measurement data receiver via the data interface.

Modern electronics require a plurality of different measurements and qualification procedures during development or servicing. The present invention is based on the finding that recording only analog signals with an oscilloscope may not suffice to detect systematic errors that depend on other physical parameters, like e.g. a temperature.

The present invention therefore provides the multi probe measurement device. The multi probe measurement device comprises probe interfaces that couple different measurement probes to the multi probe measurement device.

Possible measurement probes may e.g. comprise temperature sensors, acceleration sensors, light intensity sensors, color sensors, viscosity sensors for liquids and gas sensors. It is understood, that any other type of sensor may also be used.

In general the values measured by the measurement probes may be seen as slow changing compared to signals that are usually measured with oscilloscopes and may comprise frequencies in the GHz range.

In the multi probe measurement device the processing unit records measurement values from the measurement probes and transmits the measurement values via the data interface to a measurement device, e.g. the measurement data receiver.

In a measuring system the measurement data receiver, e.g. an oscilloscope, may receive the measurement values from the measurement probes via the multi probe measurement device. It is understood, that the measurement data receiver may at the same time record signals via analog input channels.

The present invention therefore allows analyzing the values measured by the measurement probes together with the analog signals measured via the analog channels of the measurement data receiver to perform an in depth analysis of the respective device under test.

It is for example possible to detect and analyze droop effects in amplifiers that are mainly temperature induced. A temperature rise in the amplifier may e.g. be caused by a voltage rise at the inputs. It will take the amplifier some time to reach the final temperature leading to the so called droop, a shift of the amplification. The possibility to analyze the behavior of an amplifier during temperature changes may provide valuable information for optimization of the amplifier.

Another exemplary application is in housings of electronic devices, where a running speed of a cooling fan is adapted to the temperature in the housing. The fan may be provided with an acceleration or revolution sensor as measurement probes. The developer may then e.g. analyze if providing the fan electronics with input signals, e.g. PWM input signals, results in the required revolutions. It is further possible to analyze if the fan works properly over the full temperature range. If the fan speed drops at certain temperatures, it is possible to analyze internal signals of the fan electronics at the specific temperatures. With additional temperature sensors, it is further possible to analyze the thermal inertia of the full system, i.e. the housing with the integrated electronic devices.

In another example, a temperature range may be defined for an electronic device, e.g. a GPS navigation system. If during development of the electronic device defects are detected at certain temperatures within the temperature range, it is possible to fully analyze the internal details of the electronic device in view of the measured temperatures.

Another example comprises a mobile device, like e.g. a smartphone that may activate safety mechanisms if it detects that it is falling. During development of the mobile device it is possible with the present invention to measure the acceleration of the mobile device via a measurement probe and at the same time analyze internal signals of the mobile device. This allows determining if the correct safety mechanisms are activated for the respective accelerations.

In another example, a power supply may e.g. fail at elevated moisture levels. In this case a measurement probe may be provided for measuring the moisture level. The internal signals of the power supply may then be analyzed with the analog channels of the measurement data receiver.

Another example involves solar powered devices, like e.g. solar powered wrist watches. With the present invention measurement probes may measure the incident light, and the analog channels of the measurement data receiver may measure internal values of the solar powered device. This allows analyzing in detail the behavior, like e.g. stability and battery life, of the electronics in the solar powered device under different light conditions.

A further example refers to filling machines, e.g. for beverages or chemicals. It must e.g. be made sure that the valves of the filling machine are closed if the viscosity of the transported liquid is too high or that the filling quantity, e.g. of chemicals or flavorings, is exactly controlled. In such an application flow sensors may be used as measurement probes and the internal signals of the controller of the filling machine may be analyzed with the analog channels of the measurement data receiver.

It is understood, that many other applications are possible and the above examples are only presented for better understanding of the present invention.

It is a common detail to all the above examples that the parameters that are measured via the measurement probes change relatively slow compared to the signal values that may be measured via the analog channels of the measurement data receiver.

With the multi probe measurement device in combination with a common measurement data receiver it is therefore possible to perform a timely aligned or correlated analysis of internal signals of an electronic system with external parameters, like the above mentioned.

It is further understood, that the multi probe measurement device may also be used with other devices than measurement data receivers. It is for example possible to couple the multi probe measurement device to a computer. Such a computer may further receive the measurement values from a measurement data receiver and then perform the combined analysis.

It is further understood, that the multi probe measurement device may e.g. comprise a user interface, like e.g. a display to provide status information to the user, or input buttons to allow a user to configure the multi probe measurement device. The user interface may e.g. comprise a LCD display, a touchscreen, a keyboard and the like.

Further embodiments of the present invention are subject of the further subclaims and of the following description, referring to the drawings.

In a possible embodiment, the multi probe measurement device may comprise a timer coupled to the processing unit, wherein the processing unit may be configured to provide the recorded measurement values with a time stamp.

The timer may e.g. be a real time clock device or a high precision timer, like the high precision event timer in modern computers. The timer may e.g. be provided as a dedicated device or may be integrated as a logic section in the processing unit.

Such a timer may provide an absolute or a relative time to the processing unit. The processing unit may then provide the single measurement values of the measurement probes with respective time stamps. The receiver of the recorded measurement values may then use the time stamps to timely align the measurement values received from the multi probe measurement device with other measurement values.

It is understood, that as alternative or in addition to the timer, the multi probe measurement device, e.g. the processing unit, may receive a trigger or event message via the data interface. The multi probe measurement device may upon reception of the trigger message start continuously streaming the recorded measurement values to the device that is connected to the data interface. The device that is connected to the data interface may e.g. know the signal delay until it receives the measurement values and may then perform the time alignment of the recorded measurement values with the locally measured signals. As alternative, the multi probe measurement device may provide its internal signal delay via the data interface to the respective device, e.g. the measurement data receiver.

In a possible embodiment, the processing unit may be configured to receive a synchronization message via the data interface and configure the timer according to the synchronization message The device that is connected to the data interface, e.g. the oscilloscope, may be seen as a kind of master or managing node in the measuring system. This device may therefore provide the synchronization message such that e.g. the processing unit may configure the timer accordingly. This will put the timer of the multi probe measurement device in synchronization with the timer in the device that is connected to the data interface. The time stamps that the processing unit generates for the single measurement values will therefore directly correspond to the local time in the device that is connected to the data interface.

In a possible embodiment, the at least two probe interfaces may comprise a wired digital data interface, especially a USB interface and/or a LAN interface and/or a CAN interface and/or a CAN-FD interface and/or a LIN interface and/or a FlexRay interface and/or an I2C interface and/or a SENT interface, and/or wherein the at least two probe interfaces comprise a wireless digital interface, especially a WIFI interface and/or a Bluetooth interface, and/or wherein the at least two probe interfaces comprise an analog interface, especially a voltage interface and/or a current interface and/or a thermocouple interface. As alternative or in addition, the multi probe measurement device may comprise at least two probe interfaces of the same type.

The probe interfaces in the multi probe measurement device may comprise any type of interface that may be used to connect a measurement probe to the multi probe measurement device.

The multi probe measurement device may therefore comprise any type of analog interfaces, e.g. for receiving voltage or current based signals. For such analog signals, the multi probe measurement device may further comprise respective analog-to-digital converters. These converters allow the multi probe measurement device to digitize the analog values and provide these via the data interface to the device that is connected to the data interface.

The multi probe measurement device may also comprise a plurality of different digital probe interfaces, as shown above.

Such interfaces may range from parallel or serial digital interfaces that receive raw measurement values to complex bus or network interfaces, like e.g. USB, Ethernet, CAN, FlexRay or the like. The multi probe measurement device may e.g. comprise a respective host unit, if necessary. The multi probe measurement device may e.g. comprise a USB host controller for respective USB measurement probes. For Ethernet-based measurement probes the multi probe measurement device may e.g. comprise a DHCP server or the like. In any case, the multi probe measurement device may comprise any device that is necessary to provide data communication with the respective probe. Such devices may include controllers, transceivers and the like.

The same applies to the possible digital wireless interfaces, like e.g. WIFI, Bluetooth, ZigBee or any other, also proprietary, interface.

It is further understood, that the processing unit may comprise a conversion element or function that converts the measurement values received via the probe interfaces into a data format that may be transmitted via the data interface.

In a possible embodiment, the data interface may comprise at least one digital data channel and/or at least one analog data channel, and especially one digital data channel and four analog data channels.

The digital channel of the data interface may be used to transmit the recorded measurement values to the device that is connected to the data interface. The analog channels in contrast may serve as replacement channels for the analog input channels of the device that is connected to the data interface, e.g. the oscilloscope. This allows connecting all required measurement probes and cables at the multi probe measurement device instead of the device that is connected to the data interface. Therefore, the cabling effort is reduced.

The multi probe measurement device may as alternative comprise respective analog frontends that may be identical to the analog frontends in the device that is connected to the data interface and provide the analog signals in digitized format to the device that is connected to the data interface.

In a possible embodiment, the multi probe measurement device may comprise a trigger unit configured to output a trigger event signal via the data interface if a predetermined condition is detected on one of the probe interfaces.

The multi probe measurement device may e.g. comprise a simple trigger unit that may provide the trigger event signal when a signal value of the recorded measurement values raises over a predetermined value. The trigger unit may however also be a complex trigger unit that allows defining complex triggering scenarios that comprise values of multiple measurement probes and e.g. specific time series of values.

It is understood, that in addition or as alternative an external trigger signal may be provided from the device that is connected to the data interface to trigger the recording of measurement values in the multi probe measurement device.

In a possible embodiment, the measurement data receiver may comprise a master clock device that may be configured to generate a synchronization message and provide the synchronization message via the data interface to the multi probe measurement device. In addition or as alternative, the synchronization message may conform to the LXI protocol, i.e. the LAN eXtension for Instrumentation.

The measurement data receiver and multi probe measurement device therefore operate timely synchronized. This allows the measurement data receiver to process the measurement values recorded by the multi probe measurement device in accordance with the respective measurement values recorded in the measurement data receiver via the analog input channels of the measurement data receiver.

The use of the LXI protocol may further lead to the measurement data receiver and/or the multi probe measurement device comprising the respective web interface for configuration of the devices by the user.

In a possible embodiment, the measurement data receiver may comprise a first number of analog input channels and a switching matrix. Further, the multi probe measurement device may comprise a second number of analog input channels. The switching matrix may be configured to controllably switch up to the first number of analog input channels of the measurement data receiver to the data interface for receiving analog signals from the analog inputs of the multi probe measurement device.

With the help of the switching matrix, the measurement data receiver may use two different signal sources for high speed signal recording.

The measurement data receiver may e.g. use its own analog input channels to perform high speed signal recording of analog signals. In this case the respective measurement probes may be directly coupled to the measurement data receiver.

The measurement data receiver may however also use the analog input channels of the multi probe measurement device as a kind of remote measurement channels. The multi probe measurement device may e.g. comprise respective connectors for the high speed measurement probes that are usually connected to the measurement data receiver and directly connect these probes to the analog input channels of the data interface. The analog signals are therefore directly provided to the measurement data receiver from the multi probe measurement device. In the measurement data receiver the switching matrix will couple the analog input channels of the data interface with the analog frontends of the measurement data receiver. There the analog signals may be processed as if they were directly recorded via the analog inputs of the measurement data receiver.

In a possible embodiment, the measurement data receiver may comprise a control unit coupled to the data interface and configured to automatically identify the multi probe measurement device when the multi probe measurement device is connected to the measurement data receiver via the data interface.

There may exist different types of multi probe measurement devices with different configurations. Different multi probe measurement devices may e.g. comprise different probe interfaces and different data rates on the data interface and the like. Such information may e.g. be stored in the measurement data receiver and after identifying the respective multi probe measurement device, the measurement data receiver may set the respective parameters.

In a possible embodiment, the multi probe measurement device may be configured to transmit information about measurement probes connected to the multi probe measurement device via the data interface upon connection of the multi probe measurement device to the measurement data receiver.

If the multi probe measurement device transmits the information about the measurement probes that are connected to the multi probe measurement device, the measurement data receiver may automatically process the received measurement values accordingly. The measurement data receiver may e.g. know that a measurement probe comprises a temperature sensor and automatically display the measurement values as temperature values. For other types of measurement values the measurement data receiver may also automatically set the unit and e.g. a value range and the like.

In a possible embodiment, the measurement data receiver may comprise a power supply that is configured to supply the multi probe measurement device with electrical power via the data interface.

The power supply may e.g. be a Power over Ethernet power supply, a Power over USB power supply, or any other wired power supply, or a wireless power supply, like e.g. an inductive power supply.

The method of the present invention may in addition or as alternative to the above also comprise acquiring, e.g. measuring, a number, i.e. one or more, of first measurement values or values in view of a common base parameter, and acquiring, e.g. measuring, a number, i.e. one or more, of second measurement values or values in view of a common base parameter. The common base parameter may e.g. be time. The common base parameter may therefore be a time base.

The first measurement value may e.g. be an analog signal, especially a high frequency signal or a signal in a digital or analog circuit, that may be acquired via an analog channel of the measurement data receiver, e.g. an oscilloscope. The second measurement value may e.g. be a slow changing signal, like e.g. the signal of a temperature sensor or any other of the above mentioned sensors. The term "high frequency" first measurement value in this regard may refer to a frequency that is higher than the rate of change or frequency of the second measurement value. It is understood, that the second measurement value may e.g. be independently acquired. In addition, the first measurement values and the second measurement values may e.g. be acquired with different sampling rates or bandwidths. The sampling rate or bandwidth of the first measurement values may e.g. be higher than the sampling rate or bandwidth of the second measurement values. Especially, if the sampling rate or bandwidth of the second measurement values is smaller or lower than the sampling rate or bandwidth of the first measurement values, the second measurement values may be interpolated to match the sampling rate or bandwidth of time base of the first measurement values.

Further, the first measurement values may e.g. be acquired via analog channels of the measurement data receiver, e.g. an oscilloscope, e.g. as described above. The second measurement values may e.g. be acquired via a multi probe measurement device, as for example described above. A measurement memory may be provided and the first measurement values and the second measurement values may be stored in that measurement memory.

The first measurement values and the second measurement values together with the base parameter form a triple and may be stored in the acquisition memory as such a triple. This simplifies later analysis of the measured values. A plurality of such triples may e.g. form a trace or waveform.

It is clear, that both the first measurement values and the second measurement values may be displayed separately, e.g. on a screen of the measurement data receiver.

In addition, one of the second measurement values may e.g. be converted into a color or color code for the first measurement values. In an exemplary application, that second measurement value may e.g. comprise a temperature of an electronic circuit. The first measurement values may e.g. be a signal in that electronic circuit. If the second measurement value is converted into a color, the first measurement values of the respective trace may e.g. be color coded accordingly. If for example at time 0 the value of the respective one of the second measurement values corresponds to color blue and at time X corresponds to color red, it will be immediately understandable to any user that the respective values of the first measurement values have been recorded at higher temperatures. The same is e.g. possible for pressure, acceleration or any other parameter or value that may be acquired as second measurement value. Instead of a color coding, the above may also be applied in analogy to brightness. This means that the first measurement values may varied in brightness on a display of the measurement data receiver based on the values of the respective second measurement value. A combination of color and brightness modulation is also possible. The same applies e.g. to the thickness of the lines that represent the first measurement values.

The conversion of the second measurement values into a color of color code may e.g. be performed via a respective formula or via a look-up table.

It is understood, that the measurement data receiver of the measuring system may comprise a processor or processing unit that may be configured to perform the above described functions.

The method of the present invention may in addition or as alternative to the above also comprise acquiring, e.g. measuring, a number, i.e. one or more, of first measurement values in view of a common base parameter, and acquiring, e.g. measuring, a number, i.e. one or more, of second measurement values or values in view of a common base parameter. The common base parameter may e.g. be time. The common base parameter may therefore be a time base.

The first measurement value may e.g. be an analog signal, especially a high frequency signal or a signal in a digital or analog circuit, that may be acquired via an analog channel of the measurement data receiver, e.g. an oscilloscope. The second measurement value may e.g. be a slow changing signal, like e.g. the signal of a temperature sensor or any other of the above mentioned sensors. The term "high frequency" first measurement value in this regard may refer to a frequency that is higher than the rate of change or frequency of the second measurement value. It is understood, that the second measurement value may e.g. be independently acquired. In addition, the first measurement values and the second measurement values may e.g. be acquired with different sampling rates or bandwidths. The sampling rate or bandwidth of the first measurement values may e.g. be higher than the sampling rate or bandwidth of the second measurement values. Especially, if the sampling rate or bandwidth of the second measurement values is smaller or lower than the sampling rate or bandwidth of the first measurement values, the second measurement values may be interpolated to match the sampling rate or bandwidth or time base of the first measurement values.

Further, the first measurement values may e.g. be acquired via analog channels of the measurement data receiver, e.g. an oscilloscope, e.g. as described above. The second measurement values may e.g. be acquired via a multi probe measurement device, as for example described above.

Further, one or more characteristic values of the first measurement parameters may e.g. be determined. Such characteristic values may e.g. comprise the period, the frequency, the mean value, a median value, the standard deviation or any other characteristic value.

A measurement memory may be provided and the first measurement values and/or the respective characteristic values may be stored in the measurement memory together with the second measurement values.

It is understood, that a respective processing unit may be provided e.g. in the measurement data receiver to determine the characteristic values. Such a processing unit may e.g. comprise a processor, an ASIC, a FPGA, a digital signal processor. If a processor is involved an instruction memory may be provided that comprises the respective instructions that when executed by the processor perform the required functions.

The first measurement values, or the respective characteristic values, and the second measurement values together with the base parameter form a triple and may be stored in the acquisition memory as such a triple. This simplifies later analysis of the measured values. A plurality of such triples may e.g. form a trace or waveform.

It is understood, that the characteristic values may e.g. be determined not only based on a single value of the respective one of the first measurement values but on a sequence of respective values or on a trace that comprises the values of the first measurement values and the second measurement values.

In addition, the characteristic values may also be determined based on a plurality of traces, e.g. independent or consecutive measurements of the same first measurement values.

It is further possible, that not all first measurement values and all second measurement parameters are stored in the memory as traces. It is for example possible that the first measurement values and/or the second measurement values are only stored if a change of the respective value occurs. A respective time stamp may also be stored. This facilitates e.g. long running or long term analysis and reduces the required amount of memory.

It is clear, that both the first measurement values, the characteristic values and/or the second measurement values may be displayed separately, e.g. on a screen of the measurement data receiver.

In addition, the characteristic values may e.g. be displayed over one of the second measurement values. For example, a period or frequency may be displayed over temperature, humidity, pressure or any other one of the second measurement values. It may also be possible to display the characteristic values in parallel over different second measurement values. The period or frequency may e.g. be displayed over multiple temperatures measured at different spots on a circuit board.

It is understood, that the measurement data receiver of the measuring system may comprise a processor or processing unit that may be configured to perform the above described functions.

As already indicated above, the measurement data receiver of the measuring system may comprise analog input channels. At least one of the analog input channels may e.g. comprise a channel trigger unit that may generate a channel trigger signal or event upon a respective trigger event, e.g. a respective signal value of a measured voltage or current. The trigger signal may e.g. be an analog or digital signal. It is understood, that the analog input channels may also comprise analog-to-digital converters and any other required electric or electronic element.

In addition, the measurement data receiver may comprise a second interface for data acquisition, like e.g. the data interface as described above, that may comprise a signal analyzer that generates a state change signal upon detection of a predetermined condition in a respective one of the second measurement values.

Further, a combiner may be provided that combines the channel trigger signal with the state change signal into a combined state signal. The combiner may e.g. comprise an AND gate or a respective function in a firmware or software. The combiner may e.g. be coupled to the analog input channels and the state change signal may trigger signal capturing or acquisition by the analog input channels. In addition, the state change signal may also trigger signal acquisition by the second interface.

It is understood, that the number, i.e. one or more, of first measurement values and a number, i.e. one or more, of second measurement values or values may be acquired by the measurement data receiver in view of a common base parameter. The common base may e.g. be time. The common base parameter may therefore be a time base.

The first measurement value may e.g. be an analog signal, especially a high frequency signal or a signal in a digital or analog circuit, that may be acquired via an analog channel of the oscilloscope. The second measurement value may e.g. be a slow changing signal, like e.g. the signal of a temperature sensor or any other of the above mentioned sensors. The term "high frequency" first measurement value in this regard may refer to a frequency that is higher than the rate of change or frequency of the second measurement value. It is understood, that the second measurement value may e.g. be independently acquired. In addition, the first measurement values and the second measurement values may e.g. be acquired with different sampling rates or bandwidths. The sampling rate or bandwidth of the first measurement values may e.g. be higher than the sampling rate or bandwidth of the second measurement values. Especially, if the sampling rate or bandwidth of the second measurement values is smaller or lower than the sampling rate or bandwidth of the first measurement values, the second measurement values may be interpolated to match the sampling rate or bandwidth or the time base of the first measurement values.

Further, the first measurement values may e.g. be acquired via analog channels of the measurement data receiver, e.g. as described above. The second measurement values may e.g. be acquired via a multi probe measurement device, as for example described above.

The first measurement values and the second measurement values together with the base parameter form a triple and may be stored in the acquisition memory as such a triple. This simplifies later analysis of the measured values. A plurality of such triples may e.g. form a trace or waveform.

The signal analyzer may e.g. be configured to perform complex signal analysis to generate the state change signal. The signal analyzer may e.g. compare an input value, e.g. a value acquired via a respective analog input channel, with a threshold value or range and generate the state change signal if the measured value is either higher or lower than the respective threshold value or is within or without the threshold range. Other possible analysis comprise analyzing the transient behavior of the second measurement values, calculating the derivative of the second measurement values, calculating the reciprocal of the second measurement values, integrating the second measurement values, delaying the second measurement values prior to performing any analysis, performing an automatic threshold estimation and an automatic range estimation.

It is understood, that the oscilloscope of the measuring system may comprise a processor or processing unit that may be configured to perform the above described functions.

BRIEF DESCRIPTION OF THE DRAWINGS

For a more complete understanding of the present invention and advantages thereof, reference is now made to the following description taken in conjunction with the accompanying drawings. The invention is explained in more detail below using exemplary embodiments which are specified in the schematic figures of the drawings, in which.

The appended drawings are intended to provide further understanding of the embodiments of the invention. They illustrate embodiments and, in conjunction with the description, help to explain principles and concepts of the invention. Other embodiments and many of the advantages mentioned become apparent in view of the drawings. The elements in the drawings are not necessarily shown to scale.

In the drawings, like, functionally equivalent and identically operating elements, features and components are provided with like reference signs in each case, unless stated otherwise.

DETAILED DESCRIPTION OF THE DRAWINGS

Figure 1:
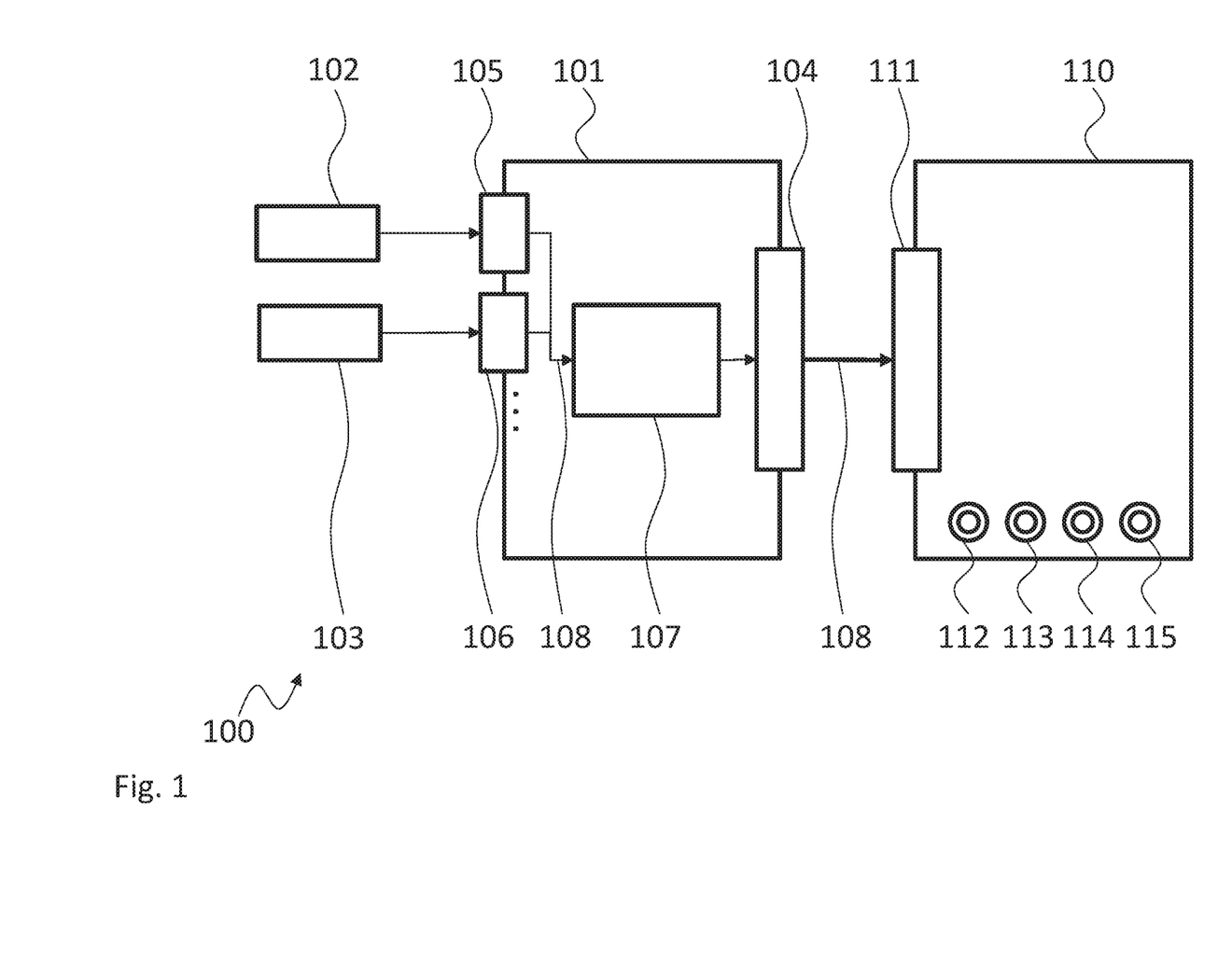
FIG. 1 shows a block diagram of an embodiment of a measuring system according to the present invention.

FIG. 1 shows a block diagram of an embodiment of a measuring system 100. The measuring system 100 comprises a multi probe measurement device 101 that is coupled to a measurement data receiver 110.

The multi probe measurement device 101 comprises two probe interfaces 105, 106. The probe interfaces 105, 106 are each coupled with one measurement probe 102, 103. It is understood, that the number of two probe interfaces 105, 106 is just exemplary and that each probe interfaces 105, 106 may be coupled to more than one measurement probe 102, 103.

The probe interfaces 105, 106 are coupled to a processing unit 107. The processing unit 107 is further coupled to a data interface 104. The data interface 104 of the multi probe measurement device 101 is coupled to a data interface 111 of the measurement data receiver 110.

During operating the processing unit 107 records measurement values 108 via the probe interfaces 105, 106 from the measurement probes 102, 103. The measurement probe 102, 103 may e.g. comprise temperature sensors, acceleration sensors, light intensity sensors, color sensors, viscosity sensors for liquids and gas sensors or any other type of sensor.

The processing unit 107 further provides the recorded measurement values 108 to the measurement data receiver 110 via the data interface 104 for further processing. The measurement data receiver 110 may e.g. be an oscilloscope that may acquire analog signals via analog measurement channels 112, 113, 114, 115. It is understood, that the analog measurement channels 112, 113, 114, 115 may e.g. comprise high speed and/or high bandwidth analog signal acquisition circuitry. Such circuitry may e.g. comprise the analog stage as it is usually encountered in oscilloscopes and may e.g. comprise filters, attenuators, impedance matching circuitry and the like.

In contrast to the analog measurement channels 112, 113, 114, 115, the probe interfaces 105, 106 and the processing unit 107 may e.g. be configured to acquire the measurement values 108 with a lower sampling rate and/or bandwidth. This allows using simpler and less complex hardware. The probe interfaces 105, 106 may e.g. comprise wired digital data interfaces, wireless digital interfaces and/or analog interfaces.

The wired digital data interface may for example comprise at least one of a USB interface, a LAN interface, a CAN interface, a CAN-FD (CAN-Flexible Data Rate) interface, a LIN interface, a FlexRay interface, an I2C interface, or a SENT interface. The wireless digital interface may e.g. comprise at least one of a WIFI interface, a Bluetooth interface, a ZigBee interface or the like. The analog interface may e.g. comprise a voltage interface or a current interface, like e.g. a thermocouple interface.

The multi probe measurement device 101 therefore provides the measurement data receiver 110 with additional information that may help in analyzing the analog signals acquired via the analog measurement channels 112, 113, 114, 115.

It is understood, that the measurement data receiver 110 may e.g. comprise a display device for showing at least the analog signals and optionally also the measurement values 108 to a user. Instead of showing the measurement values 108 to the user, the measurement values 108 may also be used to adapt the display of the analog signals.

It is for example possible to show the traces or waveforms of the analog signals as colored traces and change the color of the traces according to measurement values 108. The measurement values 108 may e.g. refer to temperature, acceleration or the like. For example a low temperature may be displayed as blue color of a trace and high temperature may be displayed as red color of the respective trace. It is e.g. also possible to provide a three dimensional view of the trace, where the height of the trace is modulated by the respective measurement values 108.

The measurement data receiver 110 may e.g. be capable of performing complex analysis function on the analog signals and e.g. determine period or a frequency or other characteristic values of the analog signals. With the multi probe measurement device 101 it is therefore possible to display such characteristic values over the measurement values 108 or to use the measurement values 108 to modulate e.g. the color or height of a trace of the characteristic values, as described above for the analog signals. It is understood, that to this end, the measurement data receiver 110 may comprise respective signal processing devices, like e.g. a processor with a respective firmware of software, a digital signal processor, respectively configured FPGAs or CPLDs or the like.

Further, the measurement data receiver 110 may e.g. use the measurement values 108 as a trigger source. This means that the measurement data receiver 110 may monitor the measurement values 108 and start measurements when certain predetermined conditions are met by the measurement values 108. This trigger generation may also be combined with the trigger generation via the analog measurement channels 112, 113, 114, 115.

It is further understood, that the multi probe measurement device 101 and the measurement data receiver 110 may synchronize with each other. The measurement data receiver 110 may e.g. execute a function like a master in a bus system and indicate to the multi probe measurement device 101 when to start and stop measurements. Further synchronization via time stamps will be described in further detail with regard to FIG. 2.

Figure 2:
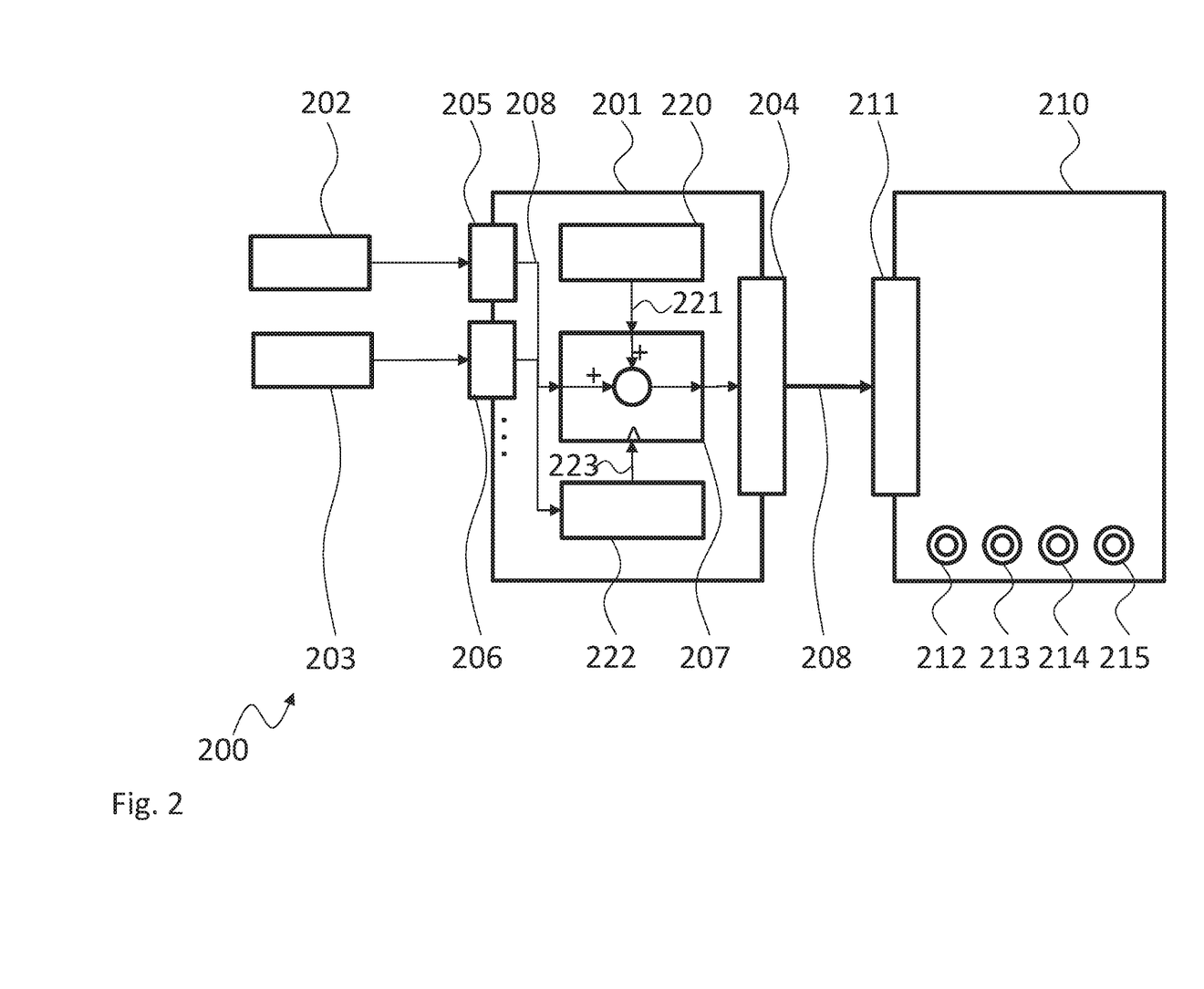
FIG. 2 shows a block diagram of an embodiment of a measuring system according to the present invention.

FIG. 2 shows a block diagram of an embodiment of a measuring system 200. The measuring system 200 is based on the measuring system 100. Therefore, the measuring system 200 comprises a multi probe measurement device 201 that is coupled via the data interface 204 to the data interface 211 of the measurement data receiver 210. It is understood, that the above explanations regarding the measuring system 100 also fully apply to the measuring system 200.

In addition to the processing unit 207, the multi probe measurement device 201 comprises a timer 220. The timer 220 provides time values or time stamps 221 to the processing unit 207. The processing unit 207 may therefore add the time stamps 221 to the measurement values 208 and provide the time stamped measurement values 208 to the measurement data receiver 210. The measurement data receiver 210 may also comprise a timer for providing time stamps to the acquired analog signals. Therefore, the measurement values 208 and the acquired analog signals may easily be aligned in time for further processing. It is understood, that the multi probe measurement device 201 and the measurement data receiver 210 may perform a clock synchronization via the data interface 204 and the data interface 211. Any one of the two may perform the role of a clock master for such a clock synchronization.

The multi probe measurement device 201 in addition comprises a trigger unit 222. The trigger unit 222 may e.g. analyze the measurement values 208 and provide a respective trigger signal 223 to the processing unit 207 that initiates the acquisition of the measurement values 208 in the processing unit 207. In addition, it is understood, that a trigger signal may also be provided by the measurement data receiver 210 via the data interface 211.

Figure 3:
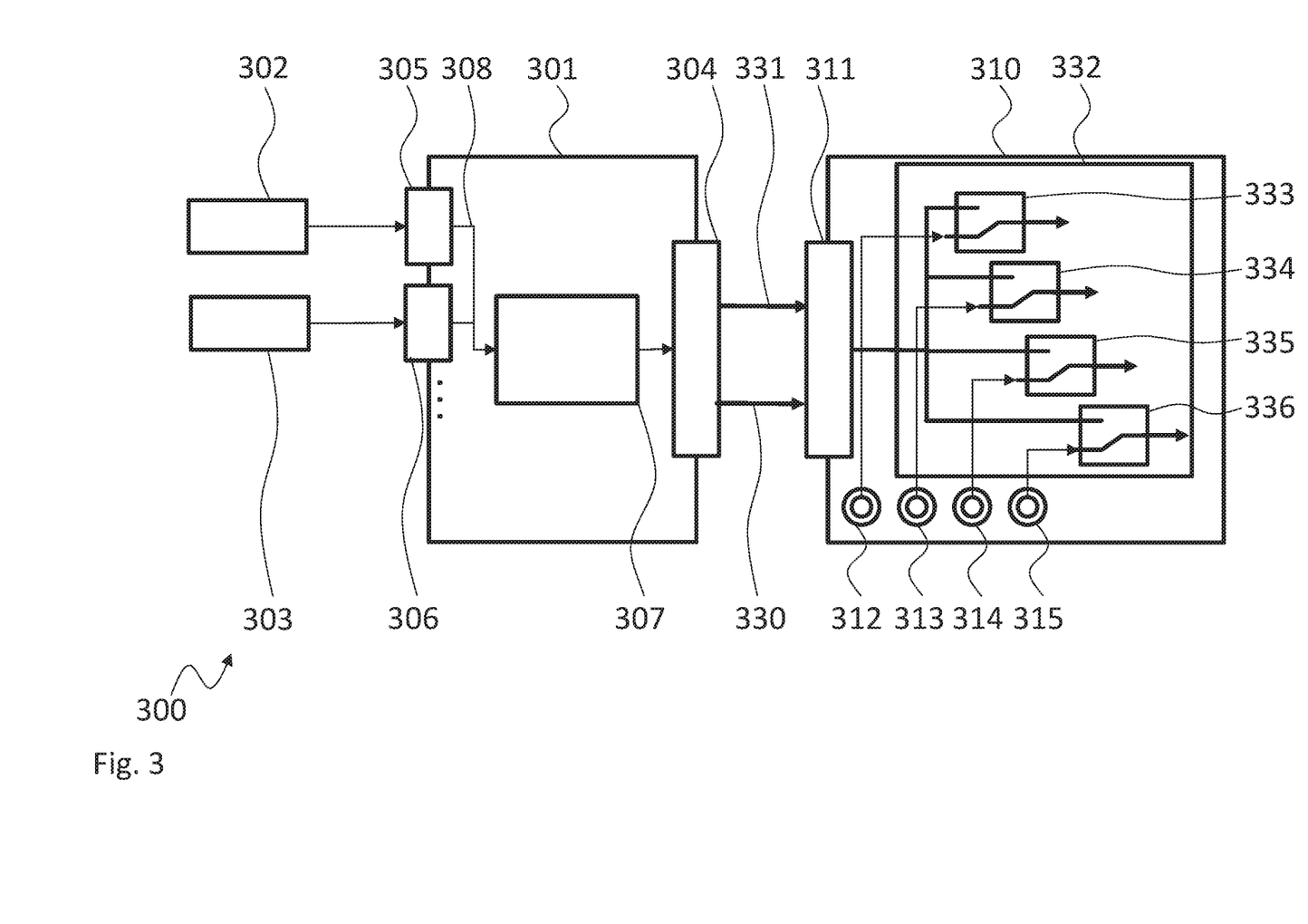
FIG. 3 shows a block diagram of an embodiment of a measuring system according to the present invention.

FIG. 3 shows a block diagram of an embodiment of a measuring system 300. The measuring system 300 is based on the measuring system 100. Therefore, the measuring system 300 also comprises the multi probe measurement device 301 that is coupled via the data interface 304 to the data interface 311 of the measurement data receiver 310. The multi probe measurement device 301 comprises the two probe interfaces 305, 306 that are coupled to measurement probes 302, 303 for acquiring measurement values 308. The processing unit 307 then provides the measurement values 308 via the data interface 304 to the measurement data receiver 310.

The data interface 304 and the data interface 311 are coupled to each other by a digital data channel 330. In addition a number, i.e. one or more, of analog data channels 331 are provided. In the measuring system 300 the measurement probes 302, 303 may comprise analog measurement probes that allow acquiring analog signals the same way that the analog measurement channels 312, 313, 314, 315 of the measurement data receiver 310 may acquire such analog signals. As alternative to the measurement probes 302, 303, the multi probe measurement device 301 may comprise respective analog measurement channels.

The acquired analog signals may then be provided to the measurement data receiver 310 via the analog data channels 331. In the measurement data receiver 310 a switching matrix 332 is provided. The switching matrix 332 serves for selecting a signal source for a following signal processing stage. The switching matrix 332 may select to either provide the signals acquired one of the analog measurement channels 312, 313, 314, 315 to the following signal processing stage or the respective signal received via one of the analog data channels 331. In the measurement data receiver 310 the switching matrix 332 is shown as comprising four switching elements 333, 334, 335, 336. Instead of four switching elements 333, 334, 335, 336 less switching elements could also be provided for only some of the analog measurement channels 112, 113, 114, 115.

For sake of clarity in the following description of the method based FIG. 4 the reference signs used above in the description of apparatus based FIGS. 1-3 will be maintained.

Figure 4:
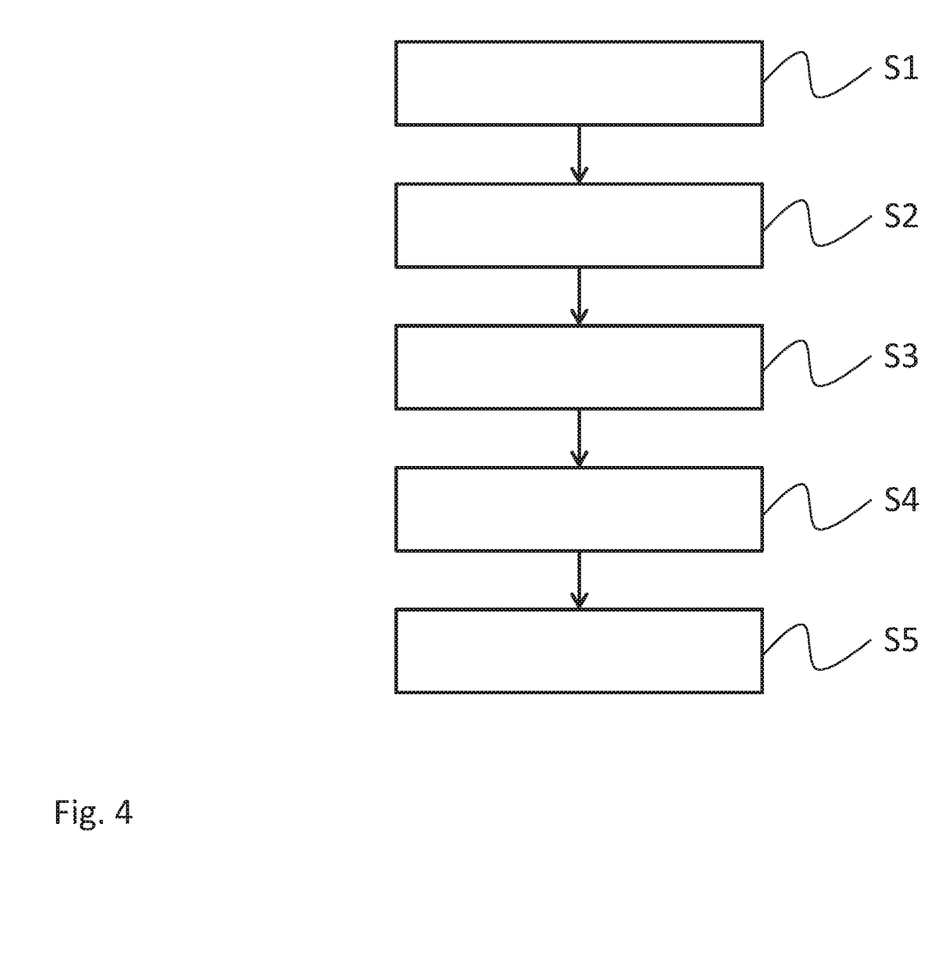
FIG. 4 shows a flow diagram of an embodiment of a method according to the present invention.

FIG. 4 shows a flow diagram of a method for measuring electrical signals. The method comprises coupling S1 a multi probe measurement device 101, 201, 301 to a measurement data receiver 110, 210, 310 with analog measurement channels 112, 113, 114, 115, 212, 213, 214, 215, 312, 313, 314, 315 via a data interface 104, 204, 304, 111, 211, 311, 311, connecting S2 at least one measurement probe 102, 103, 202, 203, 302, 303 to the multi probe measurement device 101, 201, 301, measuring S3 analog signals with the measurement data receiver 110, 210, 310, recording S4 measurement values 108, 208, 308 with the multi probe measurement device 101, 201, 301, and providing S5 the recorded measurement values 108, 208, 308 from the multi probe measurement device 101, 201, 301 to the measurement data receiver 110, 210, 310 via the data interface 104, 204, 304.

Connecting S2 the at least one measurement probe 102, 103, 202, 203, 302, 303 may e.g. be performed via a wired digital data interface, especially a USB interface and/or a LAN interface and/or a CAN interface and/or a CAN-FD interface and/or a LIN interface and/or a FlexRay interface and/or an I2C interface and/or a SENT interface, and/or via a wireless digital interface, especially a WIFI interface and/or a Bluetooth interface, and/or via an analog interface, especially a voltage interface and/or a current interface and/or a thermocouple interface.

The method may further comprise timely synchronizing the measurement of the analog signals and the recording of the measurement values 108, 208, 308.

Although specific embodiments have been illustrated and described herein, it will be appreciated by those of ordinary skill in the art that a variety of alternate and/or equivalent implementations exist. It should be appreciated that the exemplary embodiment or exemplary embodiments are only examples, and are not intended to limit the scope, applicability, or configuration in any way. Rather, the foregoing summary and detailed description will provide those skilled in the art with a convenient road map for implementing at least one exemplary embodiment, it being understood that various changes may be made in the function and arrangement of elements described in an exemplary embodiment without departing from the scope as set forth in the appended claims and their legal equivalents. Generally, this application is intended to cover any adaptations or variations of the specific embodiments discussed herein.

In the foregoing detailed description, various features are grouped together in one or more examples or examples for the purpose of streamlining the disclosure. It is understood that the above description is intended to be illustrative, and not restrictive. It is intended to cover all alternatives, modifications and equivalents as may be included within the scope of the invention. Many other examples will be apparent to one skilled in the art upon reviewing the above specification.

Specific nomenclature used in the foregoing specification is used to provide a thorough understanding of the invention. However, it will be apparent to one skilled in the art in light of the specification provided herein that the specific details are not required in order to practice the invention. Thus, the foregoing descriptions of specific embodiments of the present invention are presented for purposes of illustration and description. They are not intended to be exhaustive or to limit the invention to the precise forms disclosed; obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. Throughout the specification, the terms "including" and "in which" are used as the plain-English equivalents of the respective terms "comprising" and "wherein," respectively. Moreover, the terms "first," "second," and "third," etc., are used merely as labels, and are not intended to impose numerical requirements on or to establish a certain ranking of importance of their objects.

LIST OF REFERENCE SIGNS 100, 200, 300 measuring system
101, 201, 301 multi probe measurement device
102, 103, 202, 203, 302, 303 measurement probe
104, 204, 304 data interface
105, 106, 205, 206, 305, 306 probe interface
107, 207, 307 processing unit
108, 208, 308 measurement value
110, 210, 310 measurement data receiver
111, 211, 311, 311 data interface
112, 113, 114, 115 analog measurement channel
212, 213, 214, 215 analog measurement channel
312, 313, 314, 315 analog measurement channel
220 timer
221 time stamp
222 trigger unit
223 trigger signal
330 digital data channel
331 analog data channel
332 switching matrix
333, 334, 335, 336 switching element

The invention claimed is:

1. A measuring system for measuring signals with multiple measurement probes, the measuring system comprising:
a measurement data receiver comprising a first data interface,
a multi probe measurement device comprising at least two probe interfaces that each couple the multi probe measurement device with at least one of the measurement probes,
a second data interface that couples the multi probe measurement device to the measurement data receiver, and
a processing unit coupled to the at least two probe interfaces that records measurement values via the at least two probe interfaces from the measurement probes, wherein the processing unit is further coupled to the second data interface and provides the recorded measurement values to the measurement data receiver, and
wherein the first data interface of the measurement data receiver is coupled to the second data interface of the multi probe measurement device,
wherein the measurement data receiver comprises a first number of analog measurement channels that directly acquire a number of one or more first measurement values, and the probe measurement device acquires a number of one or more second measurement values; and
wherein a sampling rate or bandwidth of the first measurement values is higher than a sampling rate or bandwidth of the second measurement values,
wherein at least one of the analog measurement channels comprises a channel trigger unit that generates a channel trigger signal upon a respective trigger event in the acquired first measurement values,
wherein the measurement data receiver comprises a signal analyzer that generates a state change signal upon detection of a predetermined condition in a respective one of the measurement values acquired via the measurement probes,
wherein the measurement data receiver comprises a combiner that combines the channel trigger signal with the state change signal into a combined state signal by an AND-function of the channel trigger signal and the state change signal, and
wherein the acquisition of first measurement values via the analog measurement channels is triggered in the measurement data receiver based on the combined state signal.

2. The measuring system according to claim 1, the multi probe measurement device comprising a timer coupled to the processing unit, wherein the processing unit provides the recorded measurement values with a time stamp.

3. The measuring system according to claim 2, wherein the processing unit of the multi probe measurement device receives a synchronization message via the second data interface and configures the timer according to the synchronization message.

4. The measuring system according to claim 1, wherein the at least two probe interfaces of the multi probe measurement device comprise a wired digital data interface, and/or
wherein the at least two probe interfaces of the multi probe measurement device comprise a wireless digital interface, and/or
wherein the at least two probe interfaces of the multi probe measurement device comprise an analog interface; and/or
wherein the multi probe measurement device comprises at least two probe interfaces of the same type.

5. The measuring system according to claim 1, wherein the second data interface of the multi probe measurement device comprises at least one digital data channel and/or at least one analog data channel.

6. The measuring system according to claim 1, the multi probe measurement device comprising a trigger unit that outputs a trigger event signal via the second data interface if a predetermined condition is detected on one of the probe interfaces.

7. The measuring system according to claim 1, wherein the measurement data receiver comprises a master clock device that generates a synchronization message and provide the synchronization message via the first data interface to the multi probe measurement device, wherein the synchronization message conforms to an LXI (LAN extension for Instrumentation) protocol.

8. The measuring system according to claim 1, wherein the measurement data receiver comprises a switching matrix, and
wherein the multi probe measurement device comprises a second number of analog input channels, and
wherein the switching matrix controllably switches up to the first number of analog measurement channels of the measurement data receiver to the first data interface for receiving analog signals from the analog inputs of the multi probe measurement device.

9. The measuring system according to claim 1, wherein the measurement data receiver comprises a control unit coupled to the first data interface that automatically identifies the multi probe measurement device when the multi probe measurement device is connected to the measurement data receiver via the first data interface.

10. The measuring system according to claim 1, wherein the multi probe measurement device transmits information about measurement probes connected to the multi probe measurement device via the second data interface upon connection of the multi probe measurement device to the measurement data receiver.

11. The measuring system according to claim 1, wherein the measurement data receiver comprises a power supply that supplies the multi probe measurement device with electrical power via the first data interface.

12. The measuring system according to claim 1, wherein the signal analyzer performs complex signal analysis functions to generate the state change signal.

13. The measuring system according to claim 12, wherein the complex signal analysis functions comprise analyzing the transient behavior of the second measurement values and/or calculating the derivative of the second measurement values and/or calculating the reciprocal of the second measurement values and/or integrating the second measurement values and/or delaying the second measurement values prior to performing any analysis and/or performing an automatic threshold estimation and an automatic range estimation.

14. A method for measuring electrical signals, the method comprising:
coupling a multi probe measurement device to a measurement data receiver with analog measurement channels via a data interface,
connecting at least one measurement probe to the multi probe measurement device,
directly measuring analog signals with the measurement data receiver,
recording measurement values with the multi probe measurement device, and
providing the recorded measurement values from the multi probe measurement device to the measurement data receiver via the data interface,
wherein first measurement values are acquired via the analog measurement channels in the measurement data receiver, the probe measurement device acquires a number of one or more second measurement values; and
wherein a sampling rate or bandwidth of the first measurement values is higher than wherein a sampling rate or bandwidth of the second measurement values,
wherein a channel trigger unit in at least one of the analog measurement channels generates a channel trigger signal upon a respective trigger event in the acquired first measurement values,
wherein a signal analyzer in the measurement data receiver generates a state change signal upon detection of a predetermined condition in a respective one of the measurement values acquired via the measurement probes,
wherein the channel trigger signal is combined with the state change signal into a combined state signal by a combiner of the measurement data receiver applying an AND-function to the channel trigger signal and the state change signal, and
wherein the acquisition of first measurement values via the analog measurement channels is triggered in the measurement data receiver based on the combined state signal.

15. The method according to claim 14, comprising timely synchronizing the measurement of the analog signals and the recording of the measurement values.

16. The method according to claim 14, wherein connecting at least one measurement probe comprises connecting the measurement probe via a wired digital data interface, and/or
via a wireless digital interface, and/or
via an analog interface.

17. The method according to claim 14, wherein the base parameter comprises a common time base.

18. The method according to claim 14, wherein complex signal analysis functions are performed by the signal analyzer to generate the state change signal.

19. The method according to claim 14, wherein the complex signal analysis functions comprise analyzing the transient behavior of the second measurement values and/or calculating the derivative of the second measurement values and/or calculating the reciprocal of the second measurement values and/or integrating the second measurement values and/or delaying the second measurement values prior to performing any analysis and/or performing an automatic threshold estimation and an automatic range estimation.

* * * * *